United States Patent
Matossian et al.

[11] Patent Number: 5,296,272
[45] Date of Patent: Mar. 22, 1994

[54] METHOD OF IMPLANTING IONS FROM A PLASMA INTO AN OBJECT

[75] Inventors: Jesse N. Matossian, Woodland Hills; Dan M. Goebel, Tarzana, both of Calif.

[73] Assignee: Hughes Aircraft Company, Los Angeles, Calif.

[21] Appl. No.: 8,273

[22] Filed: Jan. 25, 1993

Related U.S. Application Data

[63] Continuation of Ser. No. 758,405, Aug. 30, 1991, abandoned, which is a continuation of Ser. No. 595,123, Oct. 10, 1990, abandoned.

[51] Int. Cl.$^5$ .......................... B05D 3/06; B05D 3/02
[52] U.S. Cl. .................... 427/523; 427/571; 427/598
[58] Field of Search .................. 427/523, 571, 598

[56] References Cited

U.S. PATENT DOCUMENTS

| | | | |
|---|---|---|---|
| 3,916,034 | 10/1975 | Tsuchimoto | 427/38 |
| 3,961,103 | 6/1976 | Aisenberg | 427/39 |
| 4,692,230 | 9/1987 | Nihei et al. | 204/192.31 |
| 4,718,975 | 1/1988 | Bowling et al. | 427/38 |
| 4,764,394 | 8/1988 | Conrad | 427/38 |
| 4,767,931 | 8/1988 | Sato et al. | 315/111.81 |
| 4,776,923 | 10/1988 | Spencer et al. | 156/643 |
| 4,800,100 | 1/1989 | Herbots et al. | 427/38 |
| 4,800,281 | 1/1989 | Williamson | 250/247 |
| 4,818,326 | 4/1989 | Liu et al. | 156/345 |
| 4,874,459 | 10/1989 | Coldren et al. | 156/643 |
| 4,885,070 | 12/1989 | Campbell et al. | 204/298.16 |
| 4,916,116 | 1/1990 | Yamazaki et al. | 427/38 |
| 4,937,094 | 6/1990 | Doehler et al. | 427/38 |
| 4,992,153 | 2/1991 | Bergmann et al. | 204/192.12 |
| 4,996,077 | 2/1991 | Moslehi et al. | 427/38 |
| 5,009,922 | 4/1991 | Harano et al. | 427/37 |
| 5,015,493 | 5/1991 | Gruen | 427/38 |
| 5,032,243 | 7/1991 | Bache et al. | 204/192.34 |

FOREIGN PATENT DOCUMENTS

0380119 1/1990 European Pat. Off.
63-239948 1/1989 Japan.

OTHER PUBLICATIONS

Goebel et al., "Erosion and Redeposition Experiments in the PISCES Facility" in Journal at Nuclear Materials, vol. 145-147, pp. 61-70, 1987.

J. R. Beattie et al., "Plasma Contactor Neutralizer System for ATAS Missions", IEPC '88, Oct. 3-6, 1988, pp. 1-5.

S. R. Walther, "Production of Atomic Nitrogen Ion Beams", Rev., Sci. Instrum. 81(1), Jan., 1990, 1990 American Institute of Physics.

Primary Examiner—Shrive Beck
Assistant Examiner—Benjamin L. Utech
Attorney, Agent, or Firm—V. D. Duraiswamy; W. K. Denson-Low

[57] ABSTRACT

An object which is to be implemented with ions is enclosed in a container. A plasma is generated in a chamber which is separate from, and opens into the container. The plasma diffuses from the chamber into the container to surround the object with uniform density. High voltage negative pulses are applied to the object, causing the ions to be accelerated from the plasma toward, and be implanted into, the object. Line-of-sight communication between a plasma generation source located in the chamber and the object is blocked, thereby eliminating undesirable effects including heating of the object by the source and transfer of thermally discharged material from the source to the object. Two or more chambers may be provided for generating independent plasmas of different ion species which diffuse into and uniformly mix in the container. The attributes of the different plasmas may be individually selected and controlled in the respective chambers.

5 Claims, 3 Drawing Sheets

METHOD OF IMPLANTING IONS FROM A PLASMA INTO AN OBJECT

This is a continuation of application Ser. No. 07/758,405, filed Aug. 30, 1991, abandoned, which is FWC Continuation of Ser. No. 07/595,123 filed Oct. 10, 1990, abandoned.

BACKGROUND OF THE INVENTION

1. Field of the Invention

The present invention relates to an improved plasma source arrangement for providing ions for implantation into an object. The invention is especially suited for hardening by ion implantation of large objects such as die tooling materials for the automotive industry.

2. Description of the Related Art

Plasma source ion implantation (PSII) is an ion implantation technique which circumvents the line-of-sight restriction inherent in conventional ion implantation. The basic technique is disclosed in U.S. Pat. No. 4,764,394, entitled "METHOD AND APPARATUS FOR PLASMA SOURCE ION IMPLANTATION", issued Aug. 16, 1988, to J. Conrad (University of Wisconsin Alumni Association). Ion implantation into surfaces of three-dimensional target objects is achieved by forming a plasma about the target within an enclosing container and applying repetitive pulses of negative high voltage between the target and the conductive walls of the container. Ions from the plasma are driven into the target object surface from all sides simultaneously and omnidirectionally without the need for manipulation of the target object. The plasma may be formed of a neutral gas introduced into the evacuated container and ionized therein with ionizing radiation so that a constant source of plasma is provided which surrounds the target object during the implantation process. Significant increases in the surface hardness and wear resistance characteristics of various materials are obtained with ion implantation using the PSII technique.

The conventional PSII plasma-production process disclosed in the Conrad patent is limited in several aspects, which severely restricts it application to ion implantation of large-scale objects such as dies and tools used in manufacturing automobiles. First, direct ionization of gas atoms in the PSII working volume is difficult and impractical to implement for producing large-scale plasmas, generally larger than one square meter, with densities between $10^6$ to $10^{11}$ ions/cm$^{-3}$, required to surround large scale dies for ion implantation. For filament discharges inside the container, the filament must be heated to a high temperature, on the order of 2000° C., for sufficient electron emission. At this temperature, evaporation of the filament material occurs which would be undesirable since it would coat the tool or die part without complicated baffling. Radiation emitted from unbaffled hot filaments would heat the die surface. For large scale plasmas, on the order of 20 m$^3$, a large number of filaments would be required, on the order of 20 filaments, producing as much as 1 W/cm$^2$ of heating radiation power on a die surface of 1000 cm$^2$ in area. For a 1 mA/cm$^2$ plasma implantation current density, 100 kV implantation voltage, and 1% duty cycle operation of the pulse modulator, the average power density heating the of die surface by implantation alone is also 1 W/cm$^2$. Therefore, if a conventional filament discharge technique is used for large scale plasma generation, it will double the power heating the tool or die surface during implantation, with potentially deleterious effects.

Where more than one ion species is desired for implantation, as in the case of multi-ion implantation, the ion-production of each ion specie cannot be selectively controlled when the ion generation occurs in the same container which encloses the target object. This is because all gas atoms become ionized collectively, rather than selectively. Thus, the basic PSII technique as disclosed by Conrad is only suitable for implantation of a single ion species.

In PSII, it is important to produce a plasma that is uniform in density, in order to achieve uniform implantation. In any plasma production process, plasma density gradients are always highest near the plasma production or generating source. In a conventional PSII apparatus, this restricts the location of the plasma source in the container which encloses the target object, and places yet another highly limitative constraint on the configuration of the apparatus.

SUMMARY OF THE INVENTION

In accordance with the present invention, a large-scale object which is to be implanted with ions, such as a large tool or die for use in automotive manufacturing, is enclosed in a container. A plasma is generated in a chamber which is separate from, and opens into the container or PSII working volume. The plasma diffuses from the chamber into the container to surround the object with substantially improved density compared to conventional practice described by Conrad. High voltage negative pulses are applied to the object, causing the ions to be accelerated from the plasma toward, and be implanted into, the object.

Separation of a plasma generating source disposed in the chamber from the container which encloses the object to be implanted enables the apparatus to be easily scalable for large volume plasma production, either by increasing the size of the plasma source or providing multiple sources.

Line-of-sight communication between the plasma generating source and the object is minimized, thereby eliminating undesirable effects including heating of the object by the source, and transfer of material which is thermally discharged by evaporation or sputtering from the source to the object. The plasma which diffuses into the container has substantially improved density, without the substantial gradient inherent in the conventional configuration in which plasma is generated in the same container which encloses the target object.

Two or more chambers may be provided for generating plasmas of different ion species which diffuse into and uniformly mix in the container. The anodes of the plasma sources may be physically, and therefore electrically, connected to the wall of the container, or may be physically and electrically isolated therefrom. The attributes of the different plasmas may be individually selected and controlled in the respective chambers.

These and other features and advantages of the present invention will be apparent to those skilled in the art from the following detailed description, taken together with the accompanying drawings, in which like reference numerals refer to like parts.

DETAILED DESCRIPTION OF THE INVENTION

Figure 1:
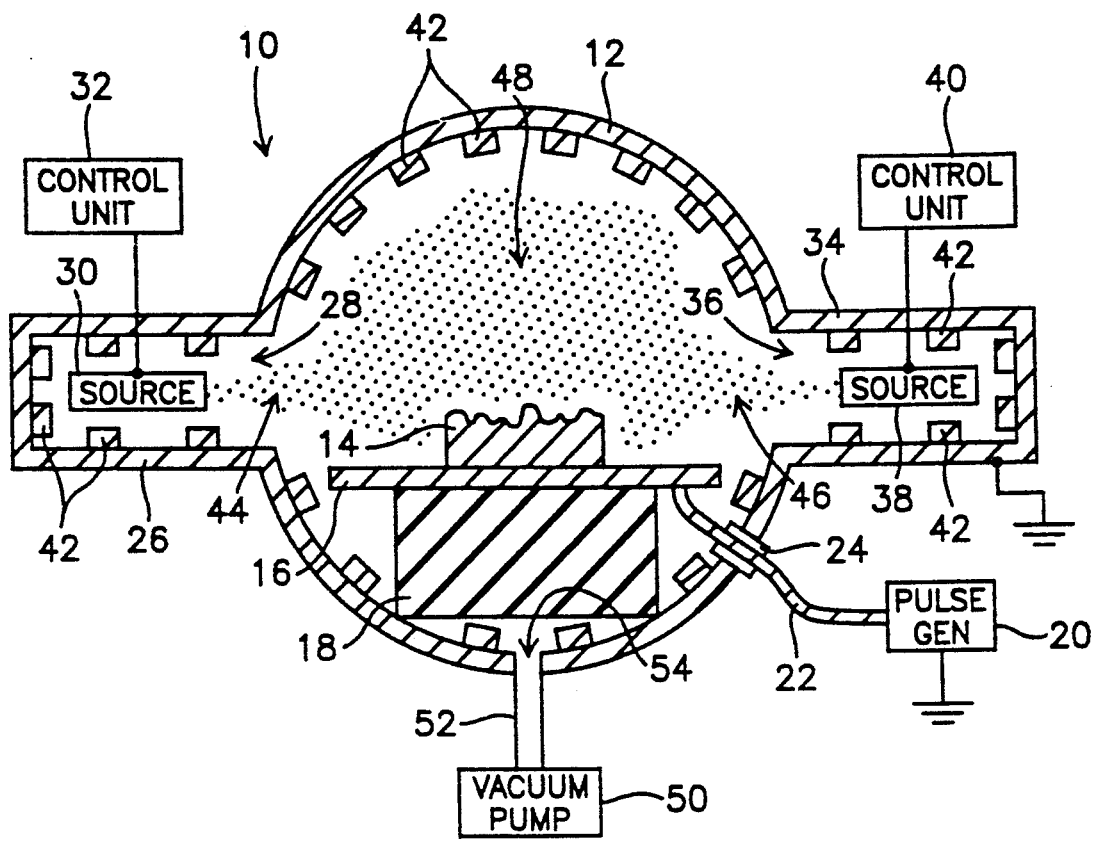
FIG. 1 is a simplified vertical sectional view of a plasma source ion implantation apparatus embodying the present invention.

Referring now to FIG. 1 of the drawing, a plasma source ion implantation apparatus embodying the present invention is generally designated as 10, and includes a container 12 made of an electrically conductive material such as steel. The container 12 is shown in vertical section, and is elongated perpendicular to the plane of the drawing. A target object 14 such as a large die tool for automotive production is mounted inside the container 12 on an electrically conductive plate 16. The object 14 may be made of a ferrous metal such as steel, or of a non-ferrous metal or other material such as epoxy. The plate 16 and object 14 are supported by a stand 18 made of an electrically insulative material. The object 14 is ohmically connected to the plate 16, but electrically insulated from the walls of the container 12.

A pulse generator 20 applies high voltage pulses of negative polarity to the object 14 through a cable 22 which is connected to the plate 16. The cable 22 passes through, but is electrically insulated from, the wall of the container 12 by an insulator 24. Although the cable 22 is illustrated as being connected to the plate 16, it is possible to omit the plate 16 and connect the cable 22 directly to the object 14. The pulse generator 20 may be constructed to generate the negative pulses between the cable 22 and ground, with the container 12 being grounded, as shown in the drawing. Although not illustrated, an electrical return path other than ground may be provided between the pulse generator 20 and container 12. Where the object is a non-ferrous metal or other material which is not electrically conductive, the negative pulses are applied to the plate 16 to create an electric field which accelerates the ions from the plasma toward the plate 16 and causes the ions to be implanted in the object 14 which is supported on the plate 16.

In accordance with the present invention, a plasma generation chamber 26 extends outwardly from the container 12. The chamber 26 is separate from the container 12, but opens into the chamber 12 either through a conduit or directly through its right end and an opening 28 formed through the left wall portion of the container 12 as viewed in the drawing. Those skilled in the art of plasma sources will recognize that the chamber 26 may contain an anode which is physically and electrically isolated from the wall of the chamber 12. A plasma generating source 30 is disposed in the chamber 26, and controlled by a control unit 32.

Although the present invention may be embodied by only one chamber and plasma source disposed therein, it is further within the scope of the invention to provide two or more chambers and associated plasma sources. As illustrated in FIG. 1, a second plasma generation chamber 34 extends outwardly from the right wall portion of the container 12 and opens thereinto through an opening 36. A plasma generating source 38 is disposed in the chamber 34, and is controlled by a control unit 40 in a manner similar to the plasma source 30. Plasma chambers 26 and 34 may also be mounted at other locations in the upper hemisphere above the target.

The sources 30 and 38 may be constructed to generate plasmas of ions of the same or different gaseous and metal species including, but not limited to, nitrogen, hydrogen, oxygen, neon, aluminum and argon. In the former case, the multiple plasma sources scale up the apparatus 10 by increasing the plasma density which is available for ion implantation of the object 14 in the container 12. In the latter case, the multiple sources enable the object 14 to be simultaneously implanted with two different types of ions. In either case, the control units 32 and 40 control the sources 30 and 38 respectively so as to separately adjust the attributes (plasma density, electron temperature, neutral density) of the plasmas 44 and 46 to individually selected values.

It is possible to practice the present invention without providing a magnetic field for confining or concentrating the plasma in the central portion of the container 12. However, the efficiency of the operation may be substantially improved by providing such means. As illustrated in FIG. 1, a plurality of magnets 42 may be spaced around the periphery of the container 12 and/or chambers 26 and 34 to provide this function.

In operation, plasmas 44 and 46 of the same or different ion species are generated by the plasma sources 30 and 38 in the separate plasma generation chambers 26 and 34 respectively. The plasmas 44 and 46 diffuse into the container 12 through the openings 28 and 36 respectively with much more uniform density than in conventional practice. In addition, the plasmas 44 and 46 uniformly mix together in the container 12 to form a composite plasma 48 which surrounds the object 14. A vacuum pump 50 and conduit 52 evacuate the container 12 through an opening 54 to a background pressure on the order of $10^{-6}$ Torr or less.

Optimally, the density of the plasma 48 in the vicinity of the object 14 will be perfectly uniform. However, in actual practice, perfectly uniform plasma density is impossible to achieve. For the purposes of the present invention, the term "uniform density" will be understood to denote a plasma density which varies within a small allowable range within which ion implantation of acceptable quality is achievable. Effective ion implantation of the object 14 will occur with a density of the plasma 48 in the range of approximately $10^6$ to $10^{11}$ ions/cm$^{-3}$. Variation in plasma density on the order of 10% to 15% is generally acceptable, but a larger variation may be tolerable in certain applications.

The high voltage negative pulses from the pulse generator 20 cause ions from the composite plasma 48, which are positively charged, to be accelerated toward and implanted into the object 14. The magnitude of the negative voltage or potential applied by the pulse generator 20 (generally between approximately 20 and 100 KV), as well as the pulse repetition frequency and duty cycle of the pulses, are selected in accordance with the specific application. Generally, a higher voltage will cause deeper implantation and a higher duty cycle will reduce the time to achieve a desired dose. However, increasing the duty cycle above a particular value could cause arcing between the plasma 48 and the object 14, an undesirable effect which may result in burning or pitting of the surface of the object 14.

Generation of plasmas in chambers which are separate from the container which encloses the target object substantially minimizes the undesirable plasma density gradients inherent in the prior art arrangement in which the plasma is generated in the same chamber that encloses the target object. The composite plasma 48, or individual plasma 44 or 46 where only one plasma source 30 or 38 respectively is used, diffuses into the container 12 and surrounds the exposed surfaces of the object 14 with substantially improved plasma density. Although it is desirable for the plasma density to be uniform in the entire volume of the container 12, the invention may be practiced with the plasma density uniform in the area of the container 12 in which the object 14 is disposed.

Figure 2:
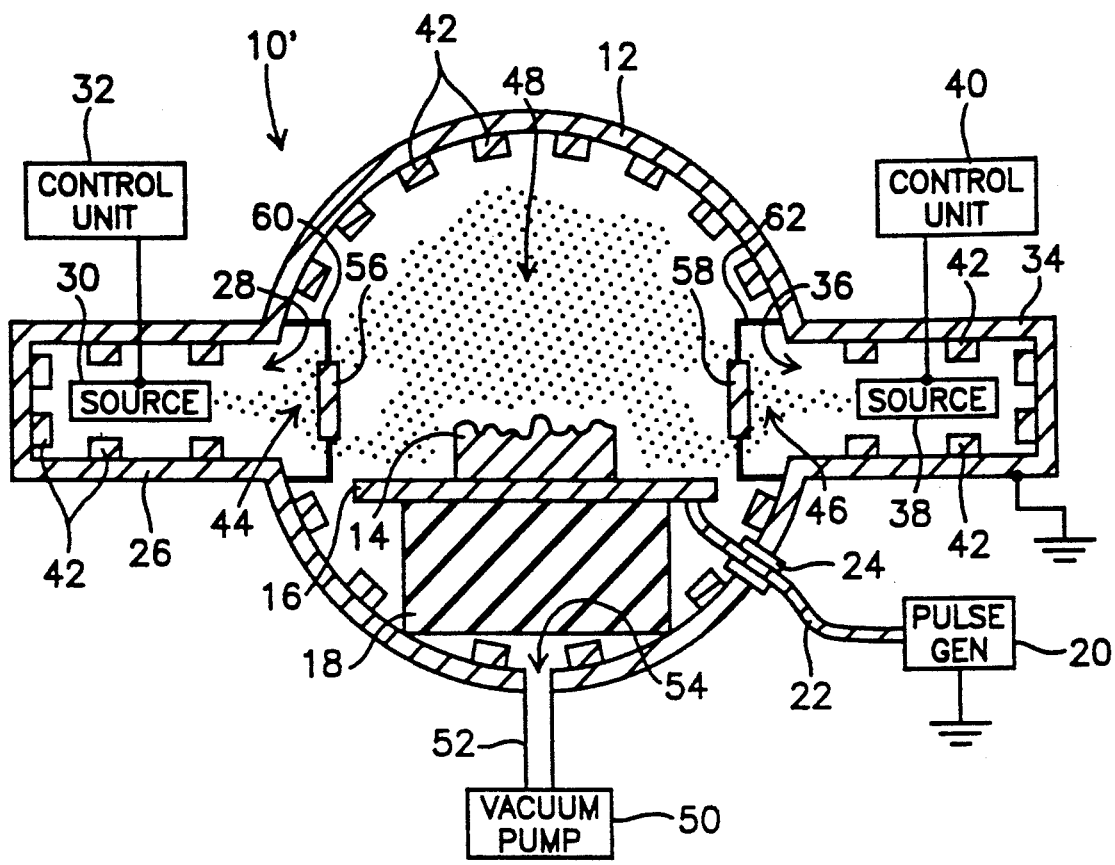
FIG. 2 is similar to FIG. 1, but shows a modified embodiment of the invention.

As will be described below, the plasma sources 30 and 38 are preferably thermionic hollow cathode units, which operate at lower temperatures and minimize the problems involving discharge of thermally generated contaminants associated with hot filament plasma sources. This, in combination with the separation of the plasma generation chambers 26 and 34 from the container 12 which encloses the object 14, may enable the plasma sources 30 and 38 to be in line of sight communication with the object 14 without the deleterious effects described above with relation to the prior art.

Where line-of-sight alignment between the plasma sources and target object is a necessary design constraint in a particular application and heat and/or discharge of thermally generated materials from the plasma sources is a problem, a modified apparatus 10' illustrated in FIG. 2 may be provided. The apparatus 10' includes, in addition to the elements illustrated in FIG. 1, baffles 56 and 58 which may be supported either inside the respective plasma sources 30 and 38 respectively (not illustrated), or in the container 12 by insulating mounts 60 and 62 respectively. The baffles 56 and 58 are provided between the plasma sources 30 and 38 respectively and the object 14, and cause the plasmas 44 and 46 to impinge against and flow therearound. The baffles 56 and 58 block line-of-sight communication between the plasma sources 30 and 38 and the object 14, and are made of a suitable material such as steel nonmagnetic or tantalum which is capable of absorbing or blocking heat and/or contaminants generated by the plasma sources 30 and 38 and preventing them from reaching the object 14. They do not, however, interfere with the achievement of a uniform plasma density in the vicinity of the object 14.

When mounted in the interior of the plasma sources 30 and 38 (not illustrated), the baffles 56 and 58 are preferably magnetic, and may be used not only to block line-of-sight communication between the plasma sources 30 and 38 and the target object 12, but may also be used to select the atomic species diffusing from the plasma sources 30 and 38 into the container 12. In the case of a nitrogen plasma, the present of such a magnetic baffle "filter" can allow predominantly atomic nitrogen ions to diffuse from one or both of the plasma sources 30 and 38 into the container 12. A plasma source for generating an atomic nitrogen plasma is described in an article entitled "Production of atomic nitrogen ion beams", by S. Walther et al, Rev. Sci. Instru. vol. 61, no. 1, Jan. 1990, pp. 315–317.

Those skilled in the art of ion implantation will recognize the advantage of producing predominantly atomic nitrogen ions, as implantation can be achieved using one-half the implantation voltage required to implant the same nitrogen dose using molecular nitrogen ions. This is not possible using the conventional PSII process as taught by Conrad in which the plasma is produced inside the implantation chamber, since predominantly molecular nitrogen ions would be produced due to the inability to isolate plasma production of different species.

Figure 3:
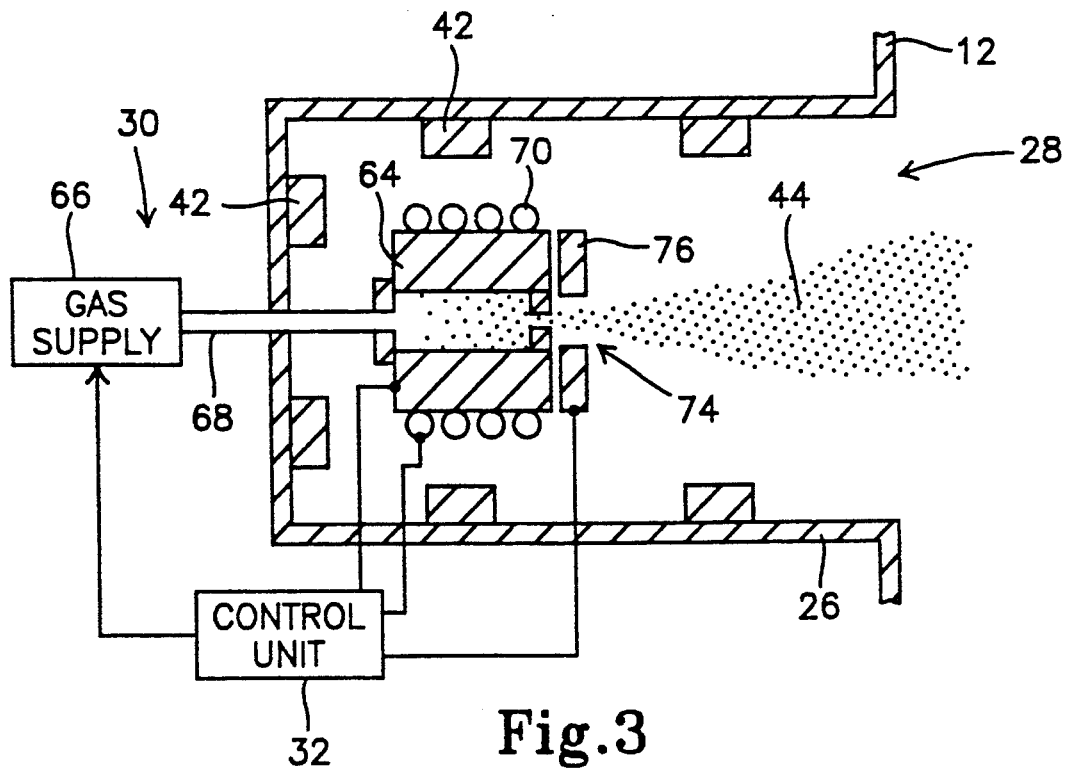
FIG. 3 is a simplified sectional view of a thermionic hollow cathode plasma generating source of the apparatus.

FIG. 3 illustrates a preferred embodiment of the plasma source 30 as a hollow cathode thermionic plasma generating unit. A detailed description of a device of this type is found in U.S. Pat. No. 4,800,281, entitled "PENNING-DISCHARGE PLASMA SOURCE", issued Jan. 24, 1989, to W. Williamson. A description of such a plasma source employed to discharge a plasma into a vacuum (outer space surrounding a shuttle orbiter) is found in an article entitled "PLASMA CONTACTOR NEUTRALIZER SYSTEM FOR ATAS MISSIONS", by J. Beattie et al, IEPC-88-030, DGLR/AIAA/JS-ASS 20th International Electric Propulsion Conference, Oct. 3–6, 1988, Garmisch-Partenkirchen, W. Germany, pp. 1–5.

The plasma source 38 is essentially similar to the source 30, with each including a hollow cathode 64 made of an electrically conductive material such as tungsten, tantalum, or rhenium. An ionizable gas such as nitrogen, neon, etc. is fed from a gas supply container 66 through a conduit 68 to the left end of the cathode 64 as viewed in the drawing. The cathode 64 is heated to its thermionic emission temperature by an electrical heating coil 70, and emits electrons into the gas flowing through the cathode 64 from left to right. The emitted electrons bombard the gas atoms, causing multiple collisions which form and sustain a plasma discharge in the cathode 64 through avalanche ionization.

An electrical voltage or potential is applied to an anode 76 which is positive with respect to the cathode 64, and further contributes to sustenance of the plasma and causes the plasma to be discharged through an opening 74 formed in the anode 76 to constitute the plasma 44. The control unit 32 supplies the required voltages to the cathode 64, anode 76, and heating coil 70, as well as controlling the supply of gas from the supply container 66.

Figure 4:
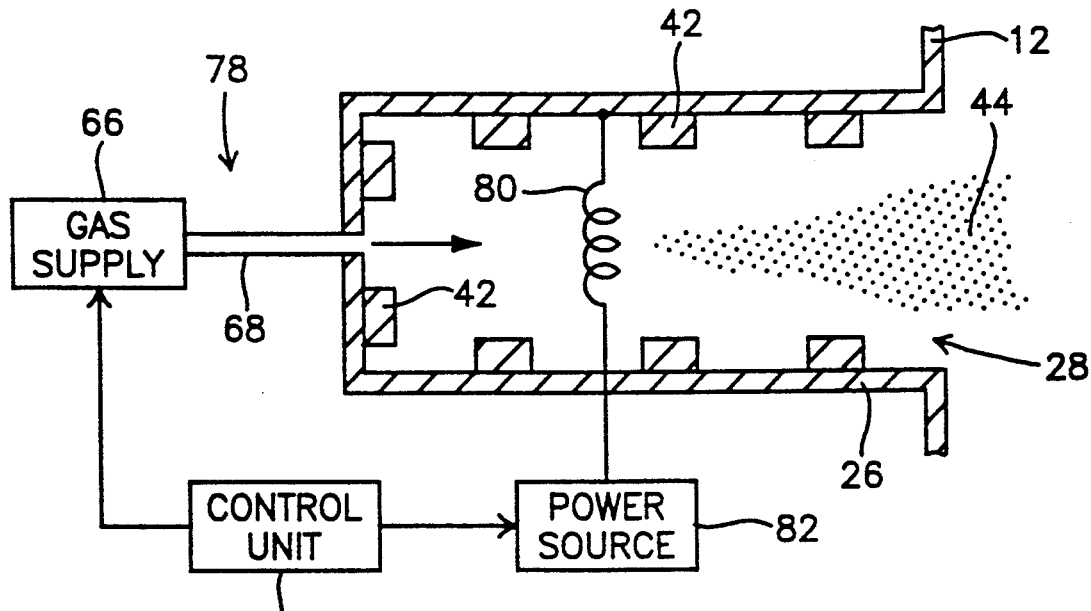
FIG. 4 is a simplified sectional view of a hot filament plasma generating source which may be alternatively used in the apparatus.

FIG. 4 illustrates an alternative plasma source 78, in which like elements are designated by the same reference numerals used in FIG. 3. The source 78 includes a hot filament 80 which is supplied with a suitable voltage from a power source 82 under control of a modified control unit 32'. The filament 80 may be made of a material similar to the cathode 64 shown in FIG. 3, and causes plasma discharge and ionization of the gas in the plasma generation chamber 26 through direct bombardment of the gas atoms by electrons which are thermionically emitted by the filament 80.

Figure 5:
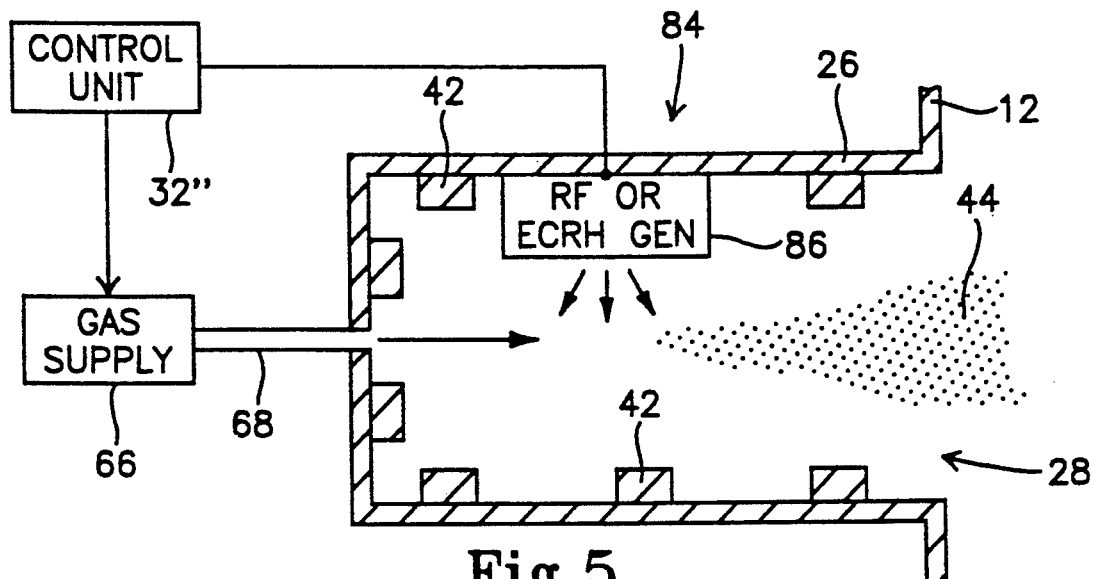
FIG. 5 is a simplified sectional view of an electromagnetic plasma generating source which may also be alternatively used in the apparatus.

FIG. 5 illustrates another alternative plasma generating source 84 which includes a signal generator 86 which is controlled by a modified control unit 32'' to generate an electromagnetic signal at a selected frequency (RF or ECRH). The electromagnetic signal causes plasma discharge ionization of the gas through electromagnetic resonance coupling.

Figure 6:
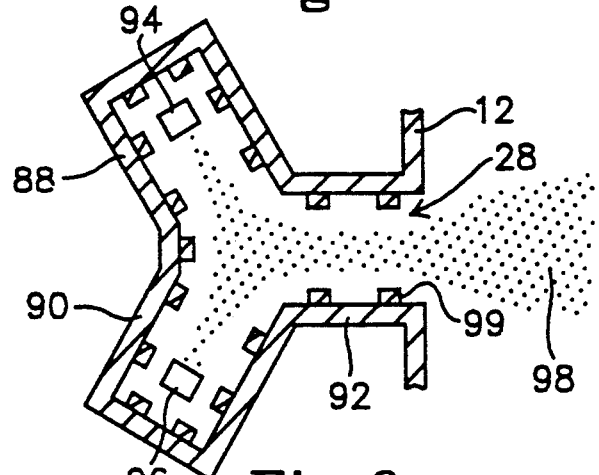
FIGS. 6 and 7 are diagrammatic plan views of alternative embodiments of the present apparatus.

Whereas the plasma generation chambers 26 and 34 described above open separately into the container 12, it is within the scope of the invention to provide multiple plasma generation chambers 88 and 90 which open into a plenum chamber 92, which in turn opens into the container 12 as illustrated in FIG. 6. Further shown are plasma sources 94 and 96 disposed in the chambers 88 and 90 respectively, for producing plasmas of the same or different ion species and permanent magnets 99 for directing the flow of these plasmas into chamber 92. A composite plasma 98 diffuses from the plenum chamber 92 into the container 12. It is within the scope of the invention to have any number of plasma generation chambers opening into a plenum chamber, and further to have any number of plenum chambers opening into the container.

Figure 7:
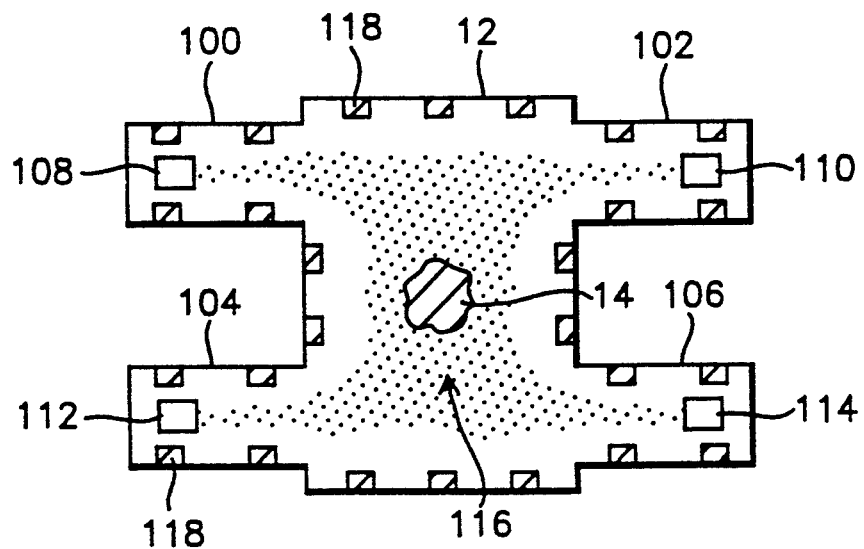

Whereas the baffles 56 and 58 are used in the apparatus 10' illustrated in FIG. 2 to block line-of-sight communication between the plasma sources 30 and 38 and the object 14, it is possible to achieve the same results without baffles through design of the plasma generation chambers and the container. As shown in FIG. 7, the container 12 is viewed from above, and four plasma generation chambers 100, 102, 104 and 106 are provided which open thereinto. Plasma sources 108, 110, 112 and 114 are provided in the respective chambers as shown. The object 14 is centrally located in the container 12 such that line-of-sight communication between the plasma sources and the object is blocked by the walls of the respective chambers. The object 14 is surrounded by a composite plasma 116 having uniform density. As with the embodiments described above, the plasmas generated by the individual sources may be of the same or different ion species. Further illustrated are magnets 118 for confining the plasma in the container 12 and chambers 100, 102, 104 and 106.

EXAMPLE

The plasma source described in the above referenced patent to Williamson was employed to generate and discharge a plasma into a large container suitable for ion implantation of dies and tools for the manufacture of automobiles. The container was in the form of a horizontally oriented, evacuated cylinder with a diameter (height) of 122 cm and a length of 305 cm. The plasma source was mounted to discharge a plasma consisting of xenon ions and electrons longitudinally into one end of the container. No magnetic confinement was used.

A discharge power of 10 W produced a plasma current of 1 ma. The plasma diffused into and filled the container, having an ion temperature with the approximate room temperature value of 1/40 eV, and an electron temperature of 0.5 eV $\sim$ 6%. The plasma density in the center of the container was $3 \times 10^6$ ions/cm$^3$, having a variation of $-13\%$ within a 61 cm radius from the center of the container. The achieved levels of density and uniformity are sufficient to perform PSII in objects having major dimensions of at least 122 cm as taught by the above referenced patent to J. Conrad, and would be substantially improved with the addition of magnetic confinement.

While several illustrative embodiments of the invention have been shown and described, numerous variations and alternate embodiments will occur to those skilled in the art, without departing from the spirit and scope of the invention. Accordingly, it is intended that the present invention not be limited solely to the specifically described illustrative embodiments. Various modifications are contemplated and can be made without departing from the spirit and scope of the invention as defined by the appended claims.

We claim:

1. A method of implanting ions from a plasma into a three-dimensional object comprising the steps of:
    (a) enclosing the three-dimensional object in a container;
    (b) generating a plasma having positive ions in a chamber separate from the container, and causing the plasma to diffuse into the container to surround the three-dimensional object with uniform density, and
    (c) applying negative pulses at least approximately 20 kV to the object to accelerate the positive ions from the plasma toward the object to implant said positive ions into the object.

2. A method as in claim 1, further comprising the step of:
    (d) applying a magnetic field to confine the plasma in the container.

3. A method as in claim 1, in which step (b) comprises the substeps of:
    (d) providing a plasma generation chamber which is separate from and communicates with the container;
    (e) providing plasma source means in the generation chamber; and
    (f) blocking line-of-sight communication between the generating means and object to block heat and contaminants from reaching said object.

4. A method as in claim 11 further comprising the step of:
    (d) generating a second plasma of ions separately from the container, the ions of the second plasma being different from the ions of said plasma, and causing the second plasma to diffuse into the container to surround the object with uniform density, the ions of the second plasma uniformly mixing with the ions of said plasma;
    step (c) comprising applying the negative pulses to the object such that the ions of the second plasma are accelerated toward and implanted into the object.

5. A method as in claim 4, in which:
    step (b) comprises separately adjusting the plasma density of said plasma; and
    step (d) comprises separately adjusting the plasma density of the second plasma.

* * * * *